(12) United States Patent
Huang

(10) Patent No.: US 8,916,935 B2
(45) Date of Patent: Dec. 23, 2014

(54) ESD CLAMP IN INTEGRATED CIRCUITS

(71) Applicant: Taiwan Semiconductor Manufacturing Company, Ltd., Hsin-Chu (TW)

(72) Inventor: Chien-Fu Huang, Puyan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/624,701

(22) Filed: Sep. 21, 2012

(65) Prior Publication Data

US 2014/0084373 A1 Mar. 27, 2014

(51) Int. Cl.
*H01L 29/78* (2006.01)

(52) U.S. Cl.
USPC ........... 257/360; 257/328; 257/335; 257/336; 257/337; 257/361; 257/362; 257/E29.255; 361/91.5

(58) Field of Classification Search
CPC . H01L 29/0642; H01L 29/0649; H01L 23/60; H02H 9/046
USPC .......... 257/328, 335–337, 360–362, E29.255; 361/91.5
See application file for complete search history.

(56) References Cited

U.S. PATENT DOCUMENTS

| | | | | |
|---|---|---|---|---|
| 6,861,711 | B2 * | 3/2005 | Mallikarjunaswamy | 257/360 |
| 7,838,940 | B2 * | 11/2010 | Schneider et al. | 257/355 |
| 8,049,307 | B2 * | 11/2011 | Jou et al. | 257/556 |
| 8,354,710 | B2 * | 1/2013 | Shrivastava et al. | 257/328 |
| 8,390,092 | B2 * | 3/2013 | Gendron et al. | 257/487 |
| 8,536,648 | B2 * | 9/2013 | Shrivastava et al. | 257/335 |
| 2012/0168906 | A1 * | 7/2012 | Kuo et al. | 257/557 |
| 2013/0140626 | A1 * | 6/2013 | Shrivastava et al. | 257/328 |

* cited by examiner

*Primary Examiner* — Matthew W Such
*Assistant Examiner* — Stephen C Smith
(74) *Attorney, Agent, or Firm* — Haynes and Boone, LLP

(57) ABSTRACT

A device includes a High-Voltage N-Well (HVNW) region have a first edge, and a High-Voltage P-Well (HVPW) region having a second edge adjoining the first edge. A first Shallow N-well (SHN) region is disposed over a lower portion of the HVNW region, wherein the first SHN region is spaced apart from the first edge by an upper part of the HVNW region. A second SHN region is disposed over a lower portion of the HVPW region, wherein the second SHN region is laterally spaced apart from the second edge. A Shallow P-well (SHP) region is disposed over the lower portion of the HVPW region, and is between the first SHN region and the second SHN region. The SHP region has a p-type impurity concentration higher than a p-type impurity concentration of the HVPW region. An isolation region is disposed over and contacting the SHP region.

23 Claims, 2 Drawing Sheets

ESD CLAMP IN INTEGRATED CIRCUITS

BACKGROUND

Electrostatic Discharge (ESD) is a known problem in the manufacturing and the using of integrated circuits. Typically, transistors have thin oxides and insulating layers that can be damaged by the electrostatic discharge, and special care is required to protect the integrated circuits from the damage caused by the ESD.

In high-voltage (HV) applications, ESD protection circuits are also needed. The ESD protection circuits may include ESD power clamps coupled between HV power nodes and electrical grounds. Conventional ESD power clamps may be implemented using Bipolar-Junction Transistors (BJTs), which are electrically broken down by ESD transients to conduct ESD currents. A conventional ESD power clamp may include a High Voltage N-Well (HVNW) region and a High Voltage P-Well (HVPW) region next to, and contacting, each other. A first shallow n-well region and a second shallow n-well region are formed in the HVNW region and HVPW region, respectively. The HVNW region and the HVPW region are further located over an n-type buried layer. A shallow trench isolation region is disposed between the first and the second shallow n-well regions, and extends from the HVNW region to the HVPW region. the ESD power clamp may further include a shallow p-well region may also be formed in the HVPW region. N+ regions and P+ regions. The power clamp forms a bipolar transistor, which is turned on to conduct ESD currents when there is an ESD transient on VDD.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

An Electrostatic Discharge (ESD) clamp is provided in accordance with various exemplary embodiments. The variations of the embodiments are discussed. Throughout the various views and illustrative embodiments, like reference numbers are used to designate like elements.

Figure 1:
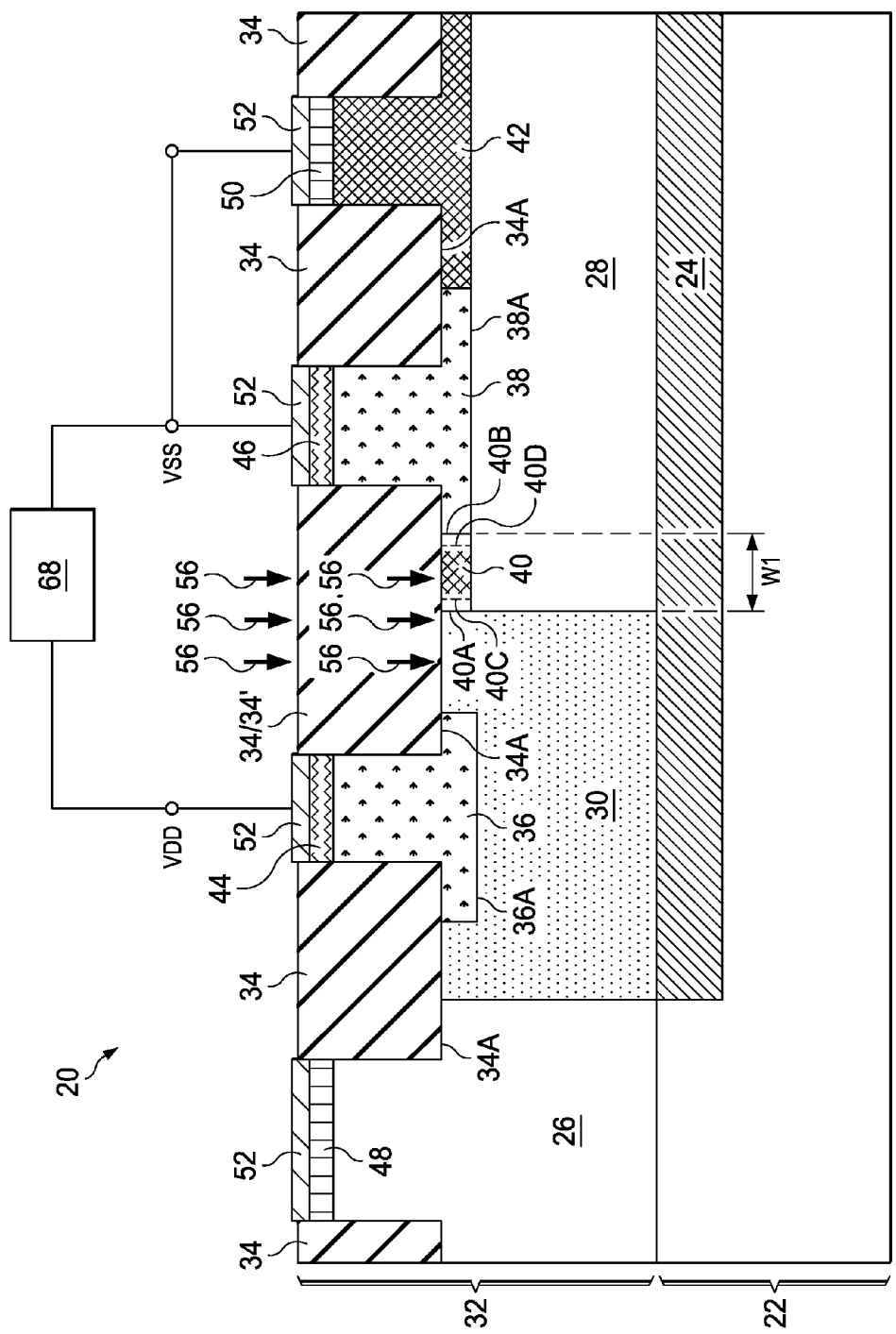
FIGS. 1 and 2 are cross-sectional views of Electrostatic Discharge (ESD) clamps in accordance with various exemplary embodiments.

FIG. 1 illustrates a cross-sectional view of ESD clamp 20 in accordance with some exemplary embodiments. ESD clamp 20 is formed on substrate 22, which may be a p-type substrate that is lightly doped with a p-type impurity. N-type Buried Layer (NBL) 24 is formed at a top surface of substrate 22. In some embodiments, NBL 24 is formed by implanting a top portion of substrate 22 with an n-type impurity, for example, to an n-type impurity concentration between about $10^{16}/cm^3$ and about $10^{18}/cm^3$.

Further referring to FIG. 1, High-Voltage P-Well (HVPW) regions 26 and 28 and High-Voltage N-Well (HVNW) region 30 are formed over substrate 22. In some embodiments, HVPW regions 26 and 28 and HVNW region 30 are formed in epitaxy layer 32, which may be a crystalline silicon layer in some embodiments, although other semiconductor materials may be used. Epitaxy layer 32 may be epitaxially grown on substrate 22 after the formation of NBL 24. HVPW regions 26 and 28 and HVNW region 30 may be formed by implanting epitaxy layer 32. HVNW region 30 is formed by implanting an n-type impurity, for example, to an impurity concentration between about $1 \times 10^{14}/cm^3$ and about $1 \times 10^{17}/cm^3$, although different impurity concentrations may be used. HVPW regions 26 and 28 are formed by implanting a p-type impurity, for example, to an impurity concentration between about $1 \times 10^{14}/cm^3$ and about $1 \times 10^{17}/cm^3$, although different impurity concentration may be used. HVNW region 30 and HVPW region 28 may overlap and contact NBL 24. HVPW region 26 may be overlying and contacting p-type substrate 22, and may be misaligned with NBL 24, although HVPW region 26 may have a small portion overlapping NBL 24. In alternative embodiments, instead of forming HVPW regions 26 and 28 and HVNW region 30 in epitaxy layer 32, no epitaxy is performed. In these embodiments, NBL 24, HVPW regions 26 and 28, and HVNW region 30 are formed by implanting semiconductor substrate 22.

Isolation regions 34 may be formed to extend from the top surface of epitaxy layer 32 into epitaxy layer 32. Isolation regions 34 may be Shallow Trench Isolation (STI) regions, and hence are referred to as STI regions 34 hereinafter. Shallow N-well (SHN) regions 36 and 38 are formed in HVNW region 30 and HVPW region 28, respectively. SHN regions 36 and 38 may have bottom surfaces 36A and 38A lower than the bottom surface 34A of STI regions 34. Bottom surfaces 36A and 38A are also higher than the bottom surfaces of the respective HVNW region 30 and HVPW region 28. SHN regions 36 and 38 may also include portions directly underlying STI regions 34. The n-type impurity concentration of SHN regions 36 and 38 is higher than the n-type impurity concentration of HVNW region 30. Furthermore, the ratio of the n-type impurity concentration of SHN regions 36 and 38 to the n-type impurity concentration of HVNW region 30 may be greater than about 10 (one order), greater than about 100 (two orders), or even higher. In some exemplary embodiments, SHN regions 36 and 38 have an n-type impurity concentration between about $1 \times 10^{15}/cm^3$ and about $1 \times 10^{18}/cm^3$, for example.

Shallow P-well (SHP) regions 40 and 42 are formed in HVPW region 28, and are over a lower portion of HVPW region 28. SHP regions 40 and 42 may have bottom surfaces lower than the bottom surfaces of STI regions 34. The bottom surfaces of SHP regions 40 and 42 are also higher than the bottom surfaces of HVPW region 28. SHP regions 40 and 42 may also include portions directly underlying STI regions 34. In some embodiments, an entirety of SHP region 40 is underlying one of STI regions 34, which is marked as STI region 34'. The p-type impurity concentration of SHP regions 40 and 42 is higher than the p-type impurity concentration of HVPW region 28. Furthermore, the ratio of the p-type impurity concentration of SHP regions 40 and 42 to the p-type impurity concentration of HVPW region 28 may be greater than about 10, greater than about 100, or higher. In some exemplary embodiments, SHP regions 40 and 42 have a p-type impurity concentration between about $1 \times 10^{15}/cm^3$ and about $1 \times 10^{18}/cm^3$, for example.

SHP region 40 is disposed between SHN regions 36 and 38, and spaces SHN regions 36 and 38 apart from each other. Furthermore, the top surface of SHP region 40 is in contact with the bottom surface 34A of the overlying STI region 34'.

The bottom surface of SHP region 40 is in contact with HVPW region 28. In some embodiments, the left edge 40A of SHP region 40 contacts HVNW region 30, and the right edge 40B of SHP region 40 contacts SHN region 38. In alternative embodiments, the left edge of SHP region 40 is at the position shown as 40C, so that SHP region 40 is spaced apart from HVNW region 30 by a portion of HVPW region 28. In yet other embodiments, the right edge of SHP region 40 is at the position shown as 40D, so that SHP region 40 is spaced apart from SHN region 38 by a portion of HVPW region 28. In some embodiments, width W1 of SHP region 40 is between about 1 μm and 4 μm, although different widths may be used.

Heavily doped n-type (N+) regions 44 and 46 are formed at the surfaces of SHN regions 36 and 38, respectively. Heavily doped p-type (P+) regions 48 and 50 are formed at the surfaces of HVPW region 26 and SHP region 42, respectively. N+ regions 44 and 46 may have n-type impurity concentrations between about $1 \times 10^{19}/cm^3$ and about $1 \times 10^{21}/cm^3$, for example. P+ regions 48 and 50 may have p-type impurity concentrations between about $1 \times 10^{19}/cm^3$ and about $1 \times 10^{21}/cm^3$, for example. Silicide regions 52 are formed on the top surfaces of N+ regions 44 and 46 and P+ regions 48 and 52.

When used as an ESD clamp, the structure in FIG. 1 is coupled between power supplies nodes. For example, SHN region 36 and N+ region 44 are connected to power supply node VDD, which is applied with power supply voltage VDD. SHN region 36 and N+ region 44 act as a collector of an n-p-n bipolar transistor formed of regions 30, 28 and 38, wherein the bipolar transistor functions as a part of ESD clamp 20. SHN region 38 and N+ region 46 (which act as an emitter of the bipolar transistor) are connected to power supply node VSS, on which power supply voltage VSS is applied. Power supply voltage VSS may also be the electrical ground voltage. SHP region 42 and P+ region 50 (which act as a base pickup region of the bipolar transistor) may also be connected to power supply node/voltage VSS. HVPW region 28 acts as the base region of the bipolar transistor. The power supply voltage VDD and/or VSS may be supplied by voltage source 68.

In the embodiments, when ESD clamp 20 is coupled between power supply voltages VDD and VSS, there exists an electrical field in the direction of arrows 56. The electrical field 56 exists in STI region 34'. Accordingly, holes in STI region 34' are pushed to, and accumulated at, the bottom surface 34A of STI region 34'. As a result, if there is no SHP region 40, and HVPW region 28 has its top surface contacting bottom surface 34A of STI region 34', due to the low p-type impurity concentration in HVPW region 28, an inversion layer (not shown) will be formed underlying and contacting the bottom surface 34A of STI region 34'. The inversion layer has accumulated electrons therein, and hence forms an n-type channel interconnecting SHN regions 36 and 38. This results a leakage current flowing from SHN region 36 to SHN region 38, which leakage current flows through the inversion layer. With the formation of SHP region 40 that have a higher p-type impurity concentration, however, the inversion layer will at least be thinner or may be eliminated. The likelihood of generating the inversion layer is also reduced. The leakage current is thus at least reduced, or substantially eliminated. In addition, simulation results also revealed that with the formation of SHP region 40, no snap back in the Transmission Line Pulse (TLP) curve was found, wherein the TLP curve is simulated from the structure shown in FIG. 1. As comparison, when no SHP region 40 is formed, the snapback is found at around 10 Volts and 15 Volts in the TLP simulation curve.

Figure 2:
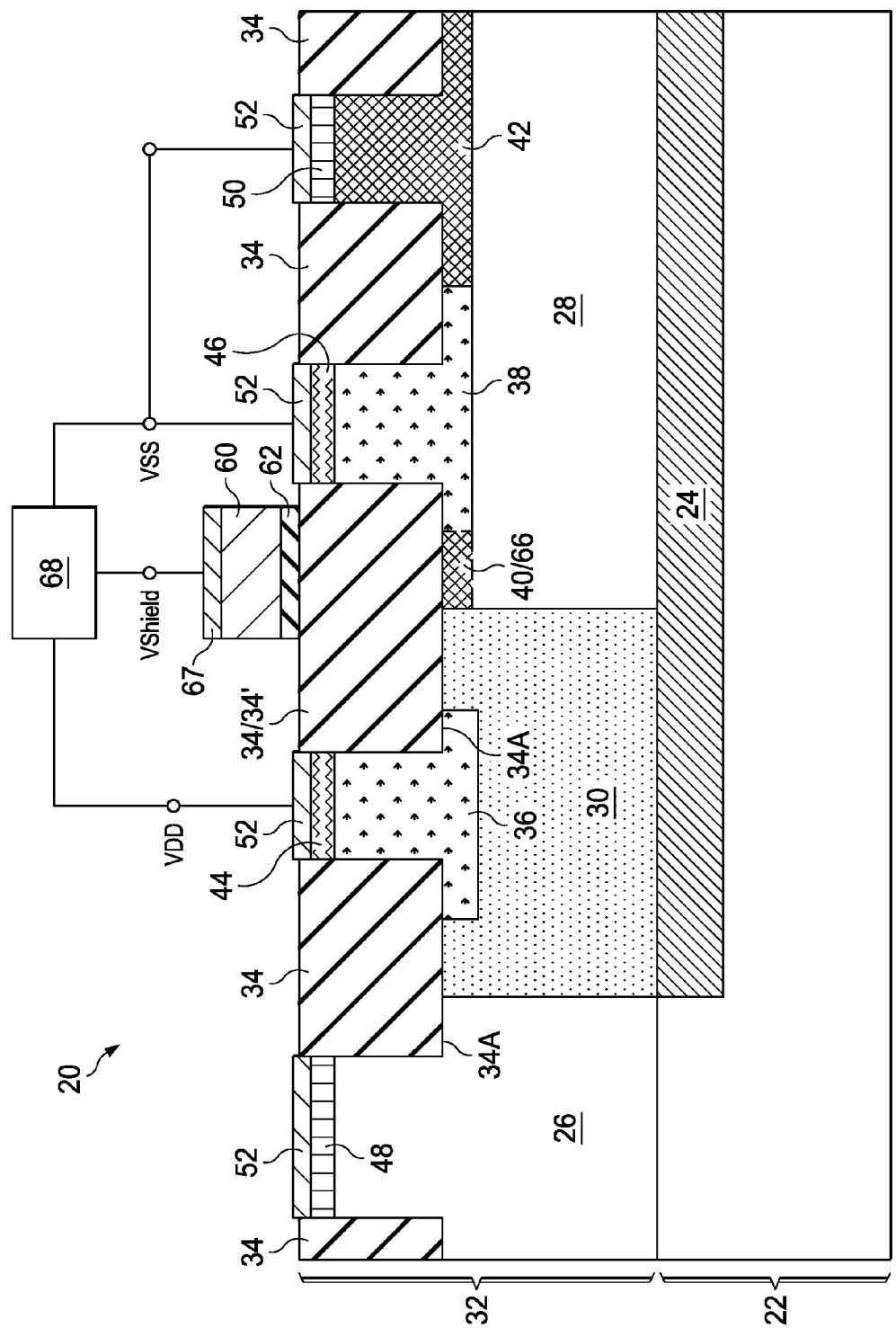

FIG. 2 illustrates the cross-sectional view of ESD clamp 20 in accordance with alternative embodiments. Unless specified otherwise, the components of ESD clamp 20 in these embodiments are essentially the same as the like components, which are denoted by like reference numerals in the embodiments shown in FIG. 1. The details regarding the formation process and the materials of the components shown in FIG. 1 may thus be found in the discussion of the embodiment shown in FIG. 1. In these embodiments, conductive layer 60 is formed over STI region 34'. Conductive layer 60 may comprise a portion overlapping region 66, which is the region underlying STI region 34', overlying HVPW region 28, and between HVNW region 30 and SHN region 38. In some embodiments, region 66 is a portion of HVPW region 28, wherein no SHP 40 is formed. In alternative embodiments, similar to the embodiments in FIG. 1, SHP region 40 is formed in region 66. The details of SHP region 40 may be essentially the same as in the embodiments of FIG. 1, and hence are not repeated herein.

Conductive layer 60 may overlap a partial portion, or an entirety, of region 66. In some embodiments, conductive layer 60 not only overlaps region 66, but also extends directly over a portion of HVNW region 30 and/or a portion of SHN region 38. Accordingly, the illustrated left edge of conductive layer 60 may extend to the left of the right edge of HVNW region 30, and/or the illustrated right edge of conductive layer 60 may extend to the right of the left edge of SHN region 38.

In some embodiments, dielectric layer 62 is underlying conductive layer 60. Dielectric layer 62 and STI region 34' may be formed of a same dielectric material (such as silicon oxide), or may be formed of different materials. Dielectric layer 62 and STI region 34' may have a visible interface regardless of whether they are formed of the same material or not since they are formed in different process steps. In alternative embodiments, no dielectric layer 62 is formed, and conductive layer 60 is overlying and contacting STI region 34'. Conductive layer 60 may be formed of polysilicon, a metal, a metal alloy, a metal silicide, or the like. In the embodiments wherein conductive layer 60 is formed of polysilicon, silicide layer 67 may be formed over conductive layer 60.

Conductive layer 60 may be applied with voltage Vshield lower than positive power supply voltage VDD, which may also be applied to N+ region 44 (the collector of an n-p-n bipolar transistor formed of regions 30, 28 and 38). In some embodiments, voltage Vshield is the VSS voltage (the electrical ground voltage, for example), which may also be applied to regions 38 and 46 (the emitter of the bipolar transistor) and regions 42 and 50 (the base pickup region of the bipolar transistor). In alternative embodiments, voltage Vshield may be any voltage higher than voltage VSS and lower than voltage VDD. Voltage Vshield and/or power supply voltages VDD and VSS may be supplied by voltage source 68.

With the formation of conductive layer 60 and the application of voltage Vshield, the electrical field in STI region 34' is at least reduced, and possibly eliminated. Accordingly, the inversion layer in region 66, if any, is at least reduced or eliminated. This results in the reduction and possibly the elimination of the leakage current that flows from SHN region 36 to SHN region 38 through the inversion layer.

In accordance with embodiments, a device includes an HVNW region have a first edge, and an HVPW region having a second edge adjoining the first edge. A first SHN region is disposed over a lower portion of the HVNW region, wherein the first SHN region is spaced apart from the first edge by an upper part of the HVNW region. A second SHN region is disposed over a lower portion of the HVPW region, wherein the second SHN region is laterally spaced apart from the second edge. The first SHN region and the second SHN region have an n-type impurity concentration higher than an n-type impurity concentration of the HVNW region. A Shallow P-well (SHP) region is disposed over the lower portion of the HVPW region, and is between the first SHN region and the second SHN region. The SHP region has a p-type impurity concentration higher than a p-type impurity concentration of the HVPW region. An isolation region is disposed over and contacting the SHP region.

In accordance with other embodiments, a device includes an HVNW region having a first edge, and an HVPW region having a second edge adjoining the first edge. A first SHN region is disposed over a lower portion of the HVNW region, wherein the first SHN region is spaced apart from the first edge by an upper part of the HVNW region. A second SHN region is disposed over a lower portion of the HVPW region, wherein the second SHN region is laterally spaced apart from the second edge. The first SHN region and the second SHN region have an n-type impurity concentration higher than an n-type impurity concentration of the HVNW region. An isolation region is overlying the HVPW region, and overlaps a region between the HVNW region and the second SHN region. A conductive layer is directly over the isolation region, wherein the conductive layer is connected to a voltage node configured to have a voltage at least lower than a VDD voltage.

In accordance with yet other embodiments, a device includes an HVNW region having a first edge, and an HVPW region having a second edge adjoining the first edge. An STI region extends from the HVNW region to the HVPW region. A first SHN region is overlying a lower portion the HVNW region, wherein the first SHN region is spaced apart from the first edge by an upper part of the HVNW region. A second SHN region is overlying a lower portion of the HVPW region, wherein the second SHN region is spaced apart from the second edge. The first and the second SHN regions have a first n-type impurity concentration higher than a second n-type impurity concentration of the HVNW region. An SHP region is between and contacts the first SHN region and the second SHN region. The SHP region has a top surface contacting a bottom surface of the STI region, and a bottom surface contacting a top surface of the HVPW region. The SHP region has a first p-type impurity concentration higher than a second p-type impurity concentration of the HVPW region by at least about one order.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a High-Voltage N-Well (HVNW) region comprising a first edge;
    a High-Voltage P-Well (HVPW) region comprising a second edge adjoining the first edge;
    a first Shallow N-well (SHN) region over a lower portion of the HVNW region, wherein the first SHN region is spaced apart from the first edge by an upper part of the HVNW region;
    a second SHN region over a lower portion of the HVPW region, wherein the second SHN region is laterally spaced apart from the second edge, and wherein the first SHN region and the second SHN region have an n-type impurity concentration higher than an n-type impurity concentration of the HVNW region;
    a first Shallow P-well (SHP) region over the lower portion of the HVPW region, wherein the first SHP region is between the first SHN region and the second SHN region, and wherein the first SHP region has a p-type impurity concentration higher than a p-type impurity concentration of the HVPW region; and
    a Shallow Trench Isolation (STI) region over and contacting the first SHP region, wherein the STI region is in physical contact with an edge of the first SHN region and an edge of the second SHN region;
    wherein an entirety of a top surface of the first SHP region is in direct contact with the STI region.

2. The device of claim 1 further comprising:
    a first heavily doped n-type region over and contacting the first SHN region;
    a second heavily doped n-type region over and contacting the second SHN region;
    a VDD node connected to the first heavily doped n-type region; and
    a VSS node connected to the second heavily doped n-type region.

3. The device of claim 1 further comprising:
    a second SHP region over and contacting the lower portion of the HVPW region, wherein the second SHP region has a same p-type impurity concentration as the first SHP region; and
    a heavily doped P-type region over and contacting the second SHP region.

4. The device of claim 3 further comprising a VSS node connected to the heavily doped P-type region.

5. The device of claim 1, wherein the first SHP region comprises:
    a first edge contacting the HVNW region; and
    a second edge contacting the second SHN region.

6. The device of claim 1 further comprising a conductive layer directly over the STI region, wherein the conductive layer is connected to a voltage lower than a VDD voltage.

7. The device of claim 6, wherein the conductive layer is connected to s VSS node.

8. A device comprising:
    a High-Voltage N-Well (HVNW) region comprising a first edge;
    a High-Voltage P-Well (HVPW) region comprising a second edge adjoining the first edge;
    a first Shallow N-well (SHN) region over a lower portion of the HVNW region, wherein the first SHN region is spaced apart from the first edge by an upper part of the HVNW region;
    a second SHN region over a lower portion of the HVPW region, wherein the second SHN region is laterally spaced apart from the second edge, and wherein the first SHN region and the second SHN region have an n-type impurity concentration higher than an n-type impurity concentration of the HVNW region;
a Shallow Trench Isolation (STI) overlying the HVPW region, and overlapping a region between the HVNW region and the second SHN region, wherein the STI region is in physical contact with an edge of the first SHN region and an edge of the second SHN region; and
a conductive layer directly over the STI region, wherein the conductive layer is connected to a voltage node configured to have a voltage at least lower than a VDD voltage;
wherein an entirety of a top surface of the first SHP region is in direct contact with the STI region.

9. The device of claim 8 further comprising a voltage source configured to provide the voltage to the conductive layer.

10. The device of claim 8, wherein the voltage node is a VSS node.

11. The device of claim 8 further comprising:
a first heavily doped n-type region over and contacting the first SHN region;
a second heavily doped n-type region over and contacting the second SHN region;
a VDD node connected to the first heavily doped n-type region; and
a VSS node connected to the second heavily doped n-type region.

12. The device of claim 11 further comprising:
a Shallow P-well (SHP) region over and contacting the lower portion of the HVPW region, wherein the SHP region has a p-type impurity concentration at least ten times higher than a p-type impurity concentration of the HVPW region; and
a heavily doped P-type region over and contacting the SHP region.

13. The device of claim 8, wherein the conductive layer overlaps an entirety of the region between the HVNW region and the second SHN region.

14. A device comprising:
a High-Voltage N-Well (HVNW) region comprising a first edge;
a High-Voltage P-Well (HVPW) region comprising a second edge adjoining the first edge;
a Shallow Trench Isolation (STI) region extending from the HVNW region to the HVPW region;
a first Shallow N-well (SHN) region over a lower portion the HVNW region, wherein the first SHN region is spaced apart from the first edge by an upper part of the HVNW region;
a second SHN region over a lower portion of the HVPW region, wherein the second SHN region is spaced apart from the second edge, and wherein the first and the second SHN regions have a first n-type impurity concentration higher than a second n-type impurity concentration of the HVNW region; and
a first Shallow P-well (SHP) region between the first SHN region and the second SHN region, and contacting the second SHN region, wherein the first SHP region comprises a top surface contacting a bottom surface of the STI region, and a bottom surface contacting a top surface of the HVPW region, and wherein the first SHP region has a first p-type impurity concentration higher than a second p-type impurity concentration of the HVPW region by at least about one order;
wherein an entirety of a top surface of the first SHP region is in direct contact with the STI region.

15. The device of claim 14 further comprising:
a first heavily doped n-type region over the first SHN region;
a second heavily doped n-type region over and contacting the second SHN region;
a VDD node connected to the first heavily doped n-type region; and
a VSS node connected to the second heavily doped n-type region.

16. The device of claim 14 further comprising:
a second SHP region over and contacting the lower portion of the HVPW region, wherein the second SHP region has a same p-type impurity concentration as the first SHP region; and
a heavily doped p-type region over and contacting the second SHP region, wherein the heavily doped p-type region is connected to a VSS node.

17. The device of claim 14 further comprising:
a conductive layer directly over the STI region, wherein the conductive layer is connected to VSS; and
a dielectric layer between the STI region and the conductive layer.

18. The device of claim 14, wherein the first p-type impurity concentration is higher than the second p-type impurity concentration by at least about two orders.

19. The device of claim 14 further comprising an n-type buried layer underlying and contacting the HVPW region and the HVNW region.

20. The device of claim 1, wherein each of the first SHN region and the second SHN region comprises a portion overlapped by the STI region.

21. The device of claim 8, wherein each of the first SHN region and the second SHN region comprises a portion overlapped by the STI region.

22. The device of claim 14, wherein each of the first SHN region and the second SHN region comprises a portion overlapped by the STI region.

23. The device of claim 14, wherein the STI region is in physical contact with an edge of the first SHN region and an edge of the second SHN region.

* * * * *